United States Patent
Iranmanesh

[19]

[11] Patent Number: 5,169,794
[45] Date of Patent: Dec. 8, 1992

[54] METHOD OF FABRICATION OF PNP STRUCTURE IN A COMMON SUBSTRATE CONTAINING NPN OR MOS STRUCTURES

[75] Inventor: Ali A. Iranmanesh, Sunnyvale, Calif.

[73] Assignee: National Semiconductor Corporation, Santa Clara, Calif.

[21] Appl. No.: 673,629

[22] Filed: Mar. 22, 1991

[51] Int. Cl.⁵ .................. H01L 21/70; H01L 29/70; H01L 27/00

[52] U.S. Cl. ........................ 437/31; 437/59; 437/57; 257/565

[58] Field of Search .................. 437/31, 59

[56] References Cited

U.S. PATENT DOCUMENTS

| | | |
|---|---|---|
| 3,955,269 | 5/1976 | Magdo et al. |
| 4,484,388 | 11/1984 | Iwasaki. |
| 4,507,847 | 4/1985 | Sullivan. |
| 4,536,945 | 8/1985 | Gray et al. |
| 4,609,568 | 9/1986 | Koh et al. |
| 4,694,562 | 9/1987 | Iwasaki et al. ............... 357/43 |
| 4,764,480 | 8/1988 | Vora. |
| 4,839,305 | 6/1989 | Brighton ..................... 437/89 |
| 4,879,255 | 11/1989 | Deguchi et al. ............... 437/59 |

OTHER PUBLICATIONS

Brassington et al., *IEEE Trans. Elect. Devices* (1989), pp. 712–719.
Momose et al., *IEDM Transactions* (Feb. 1985) p. 217.
Kapoor et al., "A High Speed High Density Single-Poly ECL Technology for Linear/Digital Applications" 1985 Custom Integrated Circuits Conference.
Gomi et al., *IEDM Technical Digest* (1988), pp. 744–747.
Burger et al., "An Advanced 0.8 μm Complementary BiCMOS Technology for Ultra-High Speed Circuit Performance" (Unknown Publicaton Data).

*Primary Examiner*—Olik Chaudhuri
*Assistant Examiner*—Long Pham
*Attorney, Agent, or Firm*—Townsend and Townsend

[57] ABSTRACT

A pnp device in BiCMOS structure (1). PNP transistors (4) are fabricated without the need for additional process steps on the same substrate as npn (2), PMOS (8), and NMOS (6) devices. The process not only requires a minimum number of additional process steps, but results in devices with near optimum device characteristics.

4 Claims, 5 Drawing Sheets

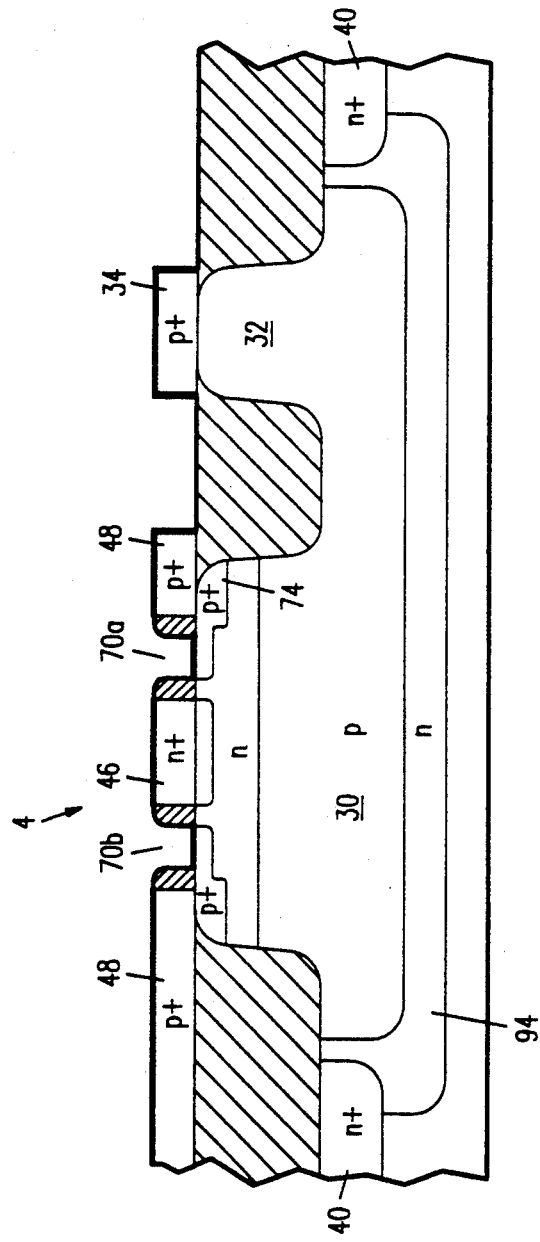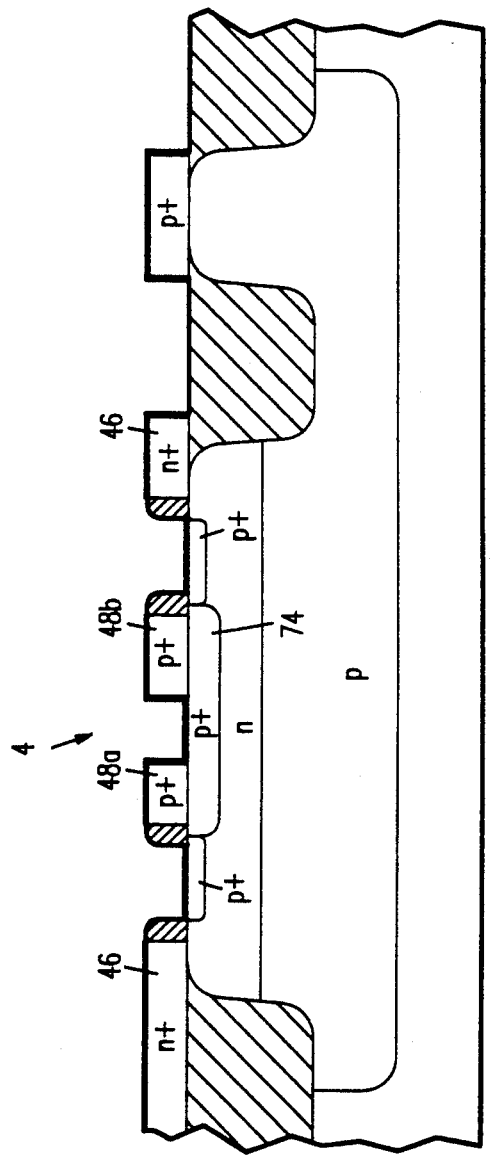

METHOD OF FABRICATION OF PNP STRUCTURE IN A COMMON SUBSTRATE CONTAINING NPN OR MOS STRUCTURES

BACKGROUND OF THE INVENTION

The present invention relates to the field of semiconductor devices and methods of fabricating semiconductor devices. More specifically, in one embodiment the invention provides semiconductor devices which include pnp, npn, and MOS devices on a single substrate, along with a method of fabrication thereof. According to some embodiments, pnp transistors are fabricated along with npn and field effect transistors without the need for additional masking or process steps.

Bipolar and metal oxide semiconductor (MOS) transistors and their methods of fabrication are well known to those of skill in the art. Often it is desirable to fabricate both MOS and bipolar devices on a single substrate to beneficially incorporate both types of transistors into a single circuit. Combined bipolar and CMOS devices are referred to herein as "BiCMOS" devices. An exemplary BiCMOS device and a method of fabricating BiCMOS devices is disclosed in Vora, U.S. Pat. No. 4,764,480, assigned to the assignee of the present invention and incorporated herein by reference for all purposes. Improved BiCMOS devices and methods of fabrication are disclosed in, for example, U.S. patent application Ser. No. 07/502,943, now abandoned, which is also incorporated herein by reference for all purposes.

Often it is desirable to incorporate both npn and pnp transistors into a single circuit. In some cases it is also desirable to incorporate pnp transistors into BiCMOS circuits. Incorporation of pnp transistors into standard processes often presents substantial difficulties, however. For example, the incorporation of pnp transistors into the fabrication processes often requires additional masking or other fabrication steps in the fabrication process. Some processes result in devices which have undesirable or significantly compromised performance characteristics.

From the above it is seen that an improved device and method of fabrication of pnp transistors in conjunction with npn and/or MOS transistors is desired.

SUMMARY OF THE INVENTION

An improved method of fabricating pnp transistors on a common die with npn and/or MOS transistors is disclosed, along with improved devices which incorporate pnp, npn, and/or MOS transistors. According to preferred embodiments the method of fabricating pnp transistors with pnp and/or MOS transistors does not require additional masking steps and provides devices which have improved performance characteristics.

According to one embodiment, the invention provides a method of fabricating semiconductor devices having a pnp transistor in a common substrate with an n-channel field effect (NMOS) transistor comprising the steps of implanting p-type dopants into first and second regions of the substrate, the first and second regions forming at least a portion of a buried layer of the pnp transistor and a well region of the NMOS transistor; forming an epitaxial silicon layer over at least the first and the second regions, a first portion of the epitaxial silicon layer forming a base region of the pnp transistor and a second portion of the epitaxial silicon layer forming a channel region of the PMOS transistor; forming an emitter region in contact with the base region of the pnp transistor; and forming source and drain regions in contact with the channel region of the NMOS transistor.

According to another embodiment, the invention provides an improved semiconductor device which includes a pnp transistor structure on a common substrate with npn bipolar transistors and field effect transistors comprising a collector region; a base region in contact with and overlying the collector region; base contacts in contact with the base region, the base contacts having oxide sidewalls on at least one sidewall thereof; and an emitter in contact with the base region, a portion of the emitter diffused into an epitaxial layer from an overlying emitter contact, a remaining portion of the emitter implanted between the emitter contact and the base contacts.

A further understanding of the nature and advantages of the inventions herein may be realized by reference to the remaining portions of the specification and the attached drawings.

BRIEF DESCRIPTION OF THE DRAWINGS

FIGS. 1B and 1C illustrate alternative embodiments of the pnp transistor shown therein.

DESCRIPTION OF THE PREFERRED EMBODIMENTS

CONTENTS

I. General

II. Fabrication Sequence

I. General

Figure 1A:
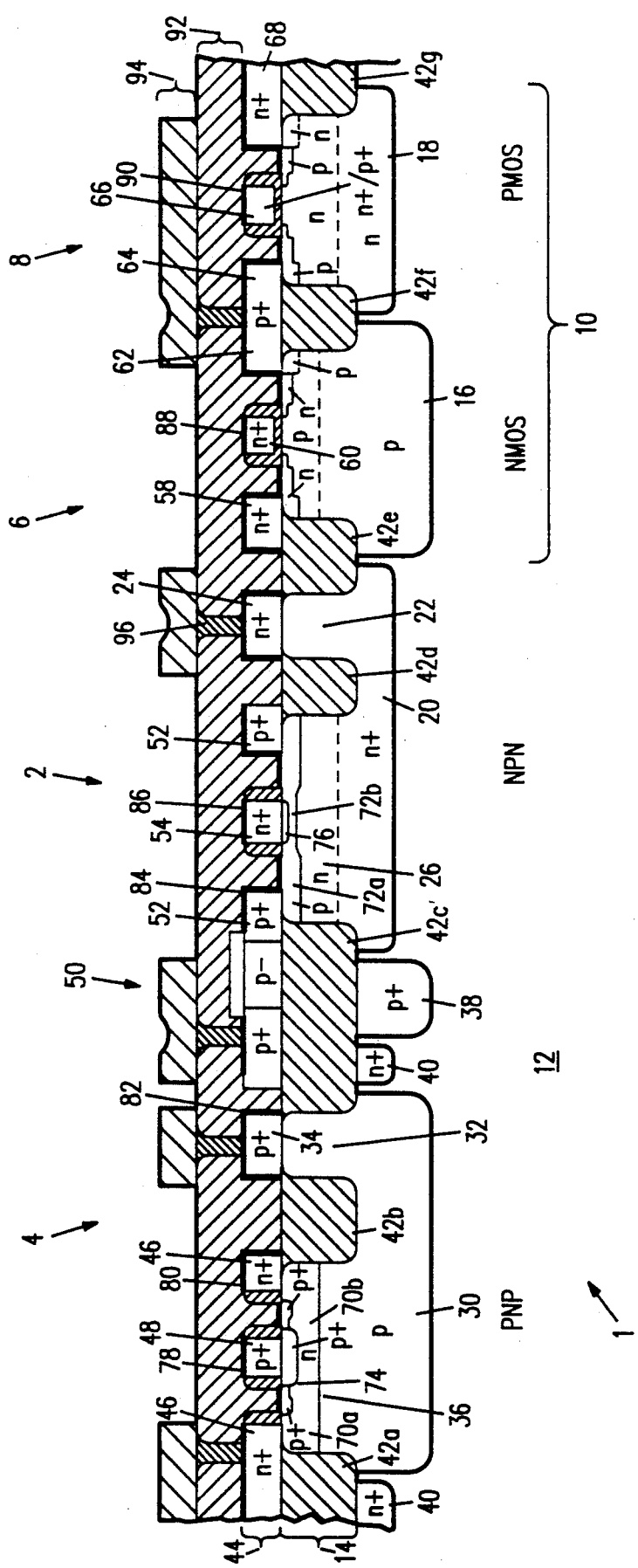
FIG. 1A is a cross-section of a BiCMOS device which includes both pnp and npn bipolar transistors.

FIG. 1A illustrates a BiCMOS device 1 in cross-section according to one embodiment of the invention. The device includes an npn bipolar transistor 2, a pnp bipolar transistor 4, an n-channel MOS transistor (NMOS transistor) 6 and a p-channel MOS transistor (PMOS transistor) 8 in the same substrate. The NMOS transistor 6 and the PMOS transistor 8 are appropriately connected to form a CMOS structure 10.

The devices are fabricated on a substrate 12. In the embodiment shown in FIG. 1A the substrate is a p-substrate having a dopant concentration of between about $1 \times 10^{13}$ and $1 \times 10^{16}$ with a preferred range of $2 \times 10^{14}$ and $3 \times 10^{15}$/cm$^3$. A reduced pressure doped n-type epitaxial silicon layer 14 is grown on top of the substrate, in which the devices are fabricated.

In most embodiments the NMOS transistor is formed in a p tub or p-well 16 and the PMOS transistor is formed in an n tub or n-well 18. In preferred embodiments the retrograde n-well 18 has a preferred peak concentration of between about $1 \times 10^{16}$ and $2 \times 10^{17}$/cm$^3$ in the channel region. The retrograde p-well 16 has a preferred peak dopant concentration of about $1 \times 10^{16}$ to $1 \times 10^{17}$/cm$^3$, although a wide range of dopant concentrations may be used without departing from the scope of the invention. Wells 16 and 18 enable the complementary conductivity devices to be formed on a single substrate.

The npn transistor 2 is provided with a heavily doped n+ buried layer 20 and collector sink 22, which together provide a low resistance connection region between a collector contact 24 and a collector 26. In preferred embodiments the buried layer 20 and sink 22 are doped to a peak concentration of between about $1\times 10^{17}$ and $1\times 10^{20}$ with a preferred range of about $5\times 10^{17}$ to $1\times 10^{20}/cm^3$.

The pnp transistor 4 is provided with a heavily doped p buried layer 30. In preferred embodiments the buried layer 30 is doped to the same dopant concentration as the p-type tub 16 since the same implants are used to perform these structures according to one embodiment. According to preferred embodiments, the threshold adjustment (p-type) implant for the CMOS transistors is used to reduce the pnp collector contact/sink resistance, this implant having a dose of about $3.5\times 10^{12}$ using 50 keV (boron). Accordingly, a sink implant for the pnp sink 22 is not necessary.

A p+ channel stop 38 is provided between the npn transistor and adjacent devices to prevent surface inversion of the lightly doped substrate which would connect the buried layer 20 with adjacent devices. An n+ channel stop 40 is provided between the pnp transistor and adjacent devices. Oxide isolation regions 42a, 42b, 42c, 42d, 42e, 42f, and 42g are provided for device isolation between the various devices and for isolation of the collector sink and base region of the bipolar transistors. These regions also provide a very high threshold voltage for the parasitic MOS device formed by the polysilicon interconnect and the substrate.

Along the surface of the device and formed from a single layer of deposited polycrystalline silicon (polysilicon) 44, are pnp base contact 46, pnp emitter contact 48, pnp collector contact 34, resistor 50, npn base contact 52, npn emitter contact 54, npn collector contact 24, NMOS drain contact 58, NMOS gate 60, NMOS source/well tap 62, PMOS drain 64, PMOS gate 66, and PMOS source/well tap contact 68.

The npn transistor is provided with a low resistance extrinsic or link base region 72a which acts as a low resistance path to the base region 72b. An npn emitter region 76 is diffused into the monocrystalline epitaxial layer from the npn emitter contact 54. The pnp emitter region 74 is formed partially from dopants diffused from the pnp emitter contact 48 and partially from dopants implanted between the base contacts 46 and the emitter contact 48. The base region of the pnp transistor includes more heavily doped link or extrinsic regions 70a and more lightly doped intrinsic base regions 70b. It is to be recognized that while regions 74 and 76 are referred to herein as the emitter contacts, these regions are sometimes referred to by those of skill in the art as emitters, either alone or in combination with the underlying diffused regions. No difference in meaning is intended herein. Sidewall oxide is formed on the npn emitter contact 76, and on the pnp emitter contact 76. Sidewall oxide is formed on the internal sidewalls of the pnp base contact, i.e., on the sidewall nearest the emitter contact.

Thin gate oxide layers are provided beneath the NMOS and PMOS transistor gates, and sidewall oxide is provided on the NMOS and PMOS gates. In preferred embodiments the NMOS gate is formed of heavily doped implanted n+ polysilicon, while the PMOS gate may be formed from n+ or p+ implanted polysilicon. N-type dopants are preferred in the PMOS gate because n+ will provide a buried channel device, having a higher carrier mobility, while p+ will provide a surface channel device.

Metallic contact 78 (i.e., a contact containing metal) such as a silicide contact is formed on the p+ pnp emitter contact. The silicide covers the top of the emitter contact, as well as the upper surface of the monocrystalline emitter region up to the sidewall oxide on the base contacts 46. Silicide contact 80 covers the upper surface of the base contact of the pnp transistor. Silicide 82 covers the pnp collector contact 34.

Silicide also contacts the npn bipolar transistor base contact 52. The silicide contact 84 covers the upper portion of the base contact, the sidewall of the base contact, as well as the horizontal upper surface of the npn base region from the sidewall of the base contact up to the sidewall oxide of the emitter. A separate silicide contact 86 is provided along the top portion of the npn emitter between the sidewall spacer oxide regions. The refractory metal contacts shown herein reduce the resistivity of the contacts and, therefore, increase the speed of products using such device.

Similarly, silicide contacts are provided for the npn collector contact 24, the NMOS gate 60, the PMOS gate 60, and p+/n+ source and drain polycrystalline contacts 58, 62, 64, and 68. Like the contact for the npn emitter 54, the silicide contacts 88 and 90 for the NMOS and PMOS gates, respectively, extend only from sidewall oxide to sidewall oxide. Conversely, the silicide contacts for the NMOS and PMOS source and drain contacts cover the sidewall of the polysilicon contacts and extend along the horizontal portion of the source/drain up to the sidewall oxide of the gates.

The structure further includes a thick (0.8 to 1.3 and preferably about 1.3 $\mu$m) oxide layer 92 to insulate the devices from metal layer 94, which is used for interconnection purposes. Tungsten plugs 96 may optionally be provided to fill the apertures in the oxide layer 92 between the first metal layer and the various silicide regions. Additional metal/oxide interconnect layers (not shown) may also be provided, topped by a passivation layer (also not shown).

The device shown in FIG. 1A provides for the combined benefits of pnp, npn, NMOS, and PMOS devices in a single substrate with optimized performance from each of these devices. At the same time, the addition of pnp devices is possible with a minimum of extra processing steps.

FIG. 1B illustrates an alternative embodiment of the pnp transistor 4 shown in FIG. 1A. In this embodiment the base contact 46 is formed between extended portions of the emitter contact 48. As shown, in this embodiment the base contact 46 is a central strip between emitter contact strips 48. Additionally an n-well 94 provides additional isolation.

FIG. 1C illustrates another alternative embodiment of the pnp transistor 4 shown in FIG. 1A. In this embodiment the emitter 48 is divided into two stringers or fingers 48a and 48b. Silicide wraps around the top of both portions, along their internal sidewalls, and along the top of the monocrystalline region therebetween. The monocrystalline region between the two polycrystalline regions 48a and 48b is implanted with p-type dopants forming a p+ emitter region 74 in conjunction with dopants diffused from the overlying poly emitter contacts. Basically, the vertical pnp can be either formed by p+ poly or p+ implant into silicon. In this embodiment the p+ implant into Si is intended to form the emitter of the vertical pnp transistor and p+ poly is only used for making contact to that emitter.

II. Fabrication Sequence

Figure 2A:
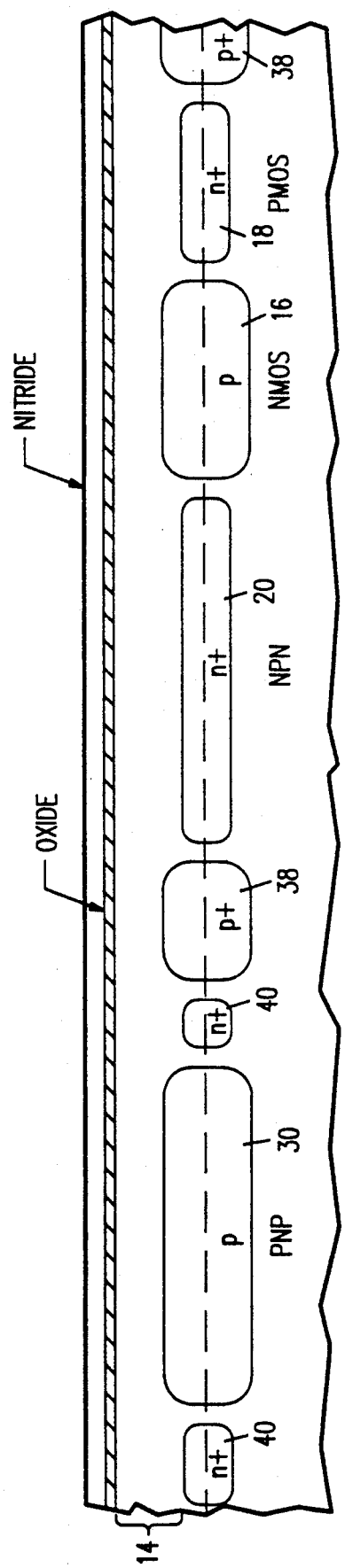
FIGS. 2A to 2E illustrate a process for making the BiCMOS device shown in FIG. 1A.

FIGS. 2A through 2E illustrate fabrication of the BiCMOS device including pnp and npn transistors as shown in FIG. 1A. In particular, FIG. 2A illustrates a cross-section of the devices at a first stage of their fabrication. To reach this stage, the substrate was denuded, and a screen oxide layer was formed. The device was then masked for simultaneous implant of the n+ tub or well 18, the npn buried layer 20, and the n+ channel stops 40 with arsenic, antimony, or the like. The implant energy used for formation of these regions is preferably about 50 to 200 keV with a preferred range of between about 60 to 80 keV. The device is then masked for simultaneous formation of the p+ channel stops 38, the NMOS tub or well 16, and the pnp buried layer 30. The implant energy used in formation of these regions is preferably between about 50 to 200 keV with a preferred range of 140 to 200 keV. The p+ regions preferably are doped with boron. The mask and oxide are then removed and a doped n-type epitaxial silicon layer 14 having a thickness of, for example, about 1.1 μm is grown across the surface of the substrate. The dopant concentration of the n-type epitaxial silicon layer will set and is selected to form the intrinsic base region of the pnp transistor as well as the channel region of the PMOS transistor. Deposited layers of thermal oxide and nitride are then formed on the surface of the device.

Figure 2B:
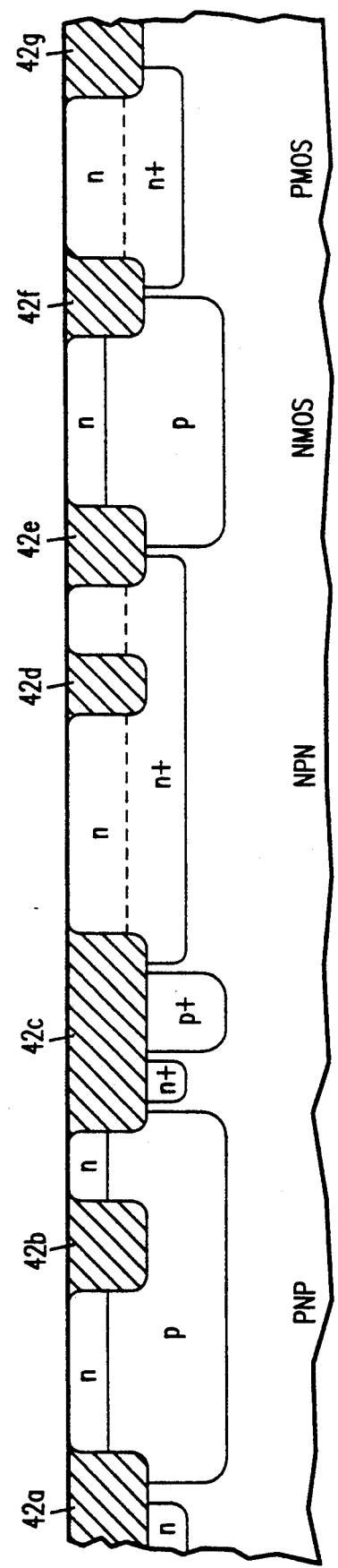

FIG. 2B illustrates the device after the next sequence of fabrication steps. After depositing sandwiched layers of thermal oxide and nitride, a photoresist mask is then formed over the surface so as to expose the epitaxial silicon where oxide regions 42a to 42g are to be formed and protect the active regions of the device. The oxide regions are formed using the well known "ISOPLANAR" process according to one embodiment. The process may be modified by changing the silicon etch procedure and depth, and by choosing different oxide/nitride/oxide sidewall layers as disclosed in, for example, U.S. patent application Ser. No. 07/502,943, now abandoned, which is incorporated herein by reference for all purposes.

Figure 2C:
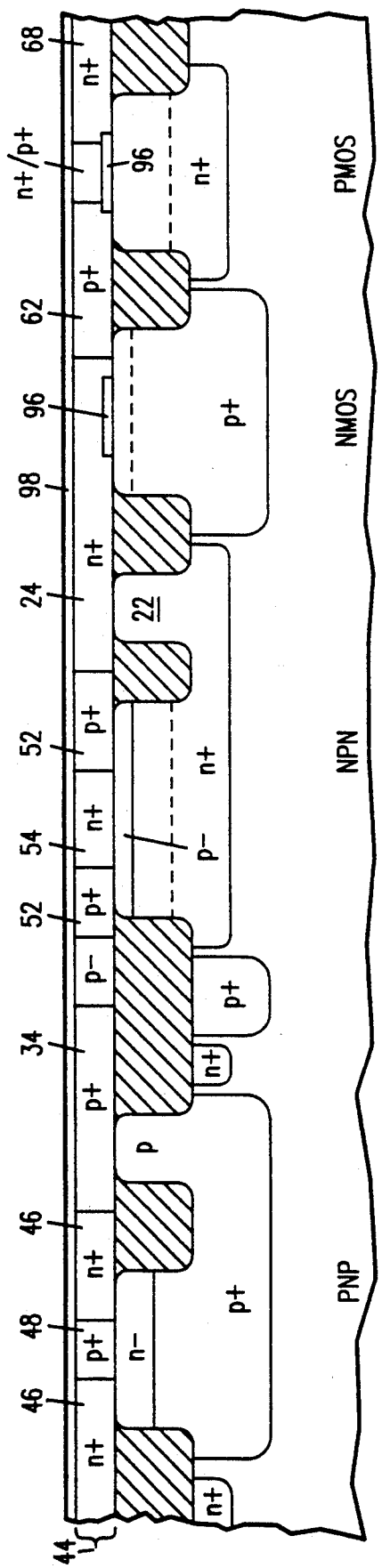

The device is illustrated in FIG. 2C after the next sequence of fabrication steps. The nitride/oxide used in forming the field oxide regions is stripped and a grown screen oxide layer having a thickness of about 250 Å is formed on the surface of the substrate. A mask is then formed, exposing only the sink region 22 of the npn transistor. A npn sink implant using an implant energy of about 100 to 190 keV with a dose of between about $1 \times 10^{14}$ and $1 \times 10^{16}$ using phosphorus as a dopant is then performed. The sink mask is then removed and a separate mask/ion implantation is performed to dope the well and channel regions of the PMOS transistor using phosphorus as a dopant. In preferred embodiments the implant energy used for the PMOS well region is between about 50 and 200 keV with energy of between about 100 and 200 keV preferred. The sink and n-well are then annealed and driven-in by heating with a conventional thermal cycle in nitrogen.

Thereafter, a mask is formed on the surface of the substrate which exposes only the NMOS and PMOS transistor regions and the sink of the pnp transistor. This mask is used for a threshold voltage implant. The implant is used to adjust the threshold voltage of the NMOS and PMOS transistors as necessary, typically to between about |0.6| and |1.0| volts. In preferred embodiments the threshold voltage implant is an implant of boron at a dose of between about $1 \times 10^{13}$ to $5 \times 10^{13}$ and preferably at 30 to 60 keV. The boron and the up-diffusing p+ from the p-well set the threshold voltage for the NMOS transistor. The threshold voltage implant in conjunction with the n-well implant sets the PMOS threshold voltage. In preferred embodiments the threshold voltage implant ultimately provides transistors with threshold voltages of $0.75 \pm 0.1$ for NMOS and $-0.85 \pm 0.1$ for PMOS transistors. This implant also reduces the collector resistance of the pnp.

The screen oxide then is stripped and a thin (on the order of 135 to 165 Å) gate oxide layer 96 is grown using means well known to those of skill in the art. A thin (on the order of 400 to 600 Å) layer of polysilicon is then deposited on the thin gate oxide layer and a mask is formed on the poly layer to define the NMOS and PMOS gates. A plasma etch removes the undesired poly from all regions of the substrate except those over the NMOS and PMOS gate oxide regions. Next, a wet etch is used to remove the underlying oxide. Protection of the gate oxide by the thin poly layer provides MOS gates having far fewer defects since they are not exposed directly to photoresist.

The gate oxide mask is removed and another layer of intrinsic polysilicon 44 having a thickness of about 1,000 to 4,000 and preferably about 3,200 Å is deposited across the entire surface of the substrate and a cap oxide layer is formed by thermal oxidation of the polysilicon layer 44. The devices are then masked with photoresist to expose at least the base region of the bipolar transistor and the lightly doped regions of the resistors. In some embodiments, only the NMOS and PMOS transistor regions are protected by the mask. A base implant is then performed and the base is annealed. In preferred embodiments the base implant uses an energy of between about 30 and 100 keV, with an implant energy of between about 30 and 50 preferred. The dose of this implant is preferably about $3 \times 10^{13}$ and $8 \times 10^{15}$. In preferred embodiments the anneal is performed by heating the structure to 900°–950° C. for 30–60 minutes, and results in a p- base region having a thickness of between about 1,000 and 2,000 Å with a dopant concentration of between about $1 \times 10^{18}$ and $1 \times 10^{19}/cm^3$, with a dopant concentration of about $5 \times 10^{18}/cm^3$ preferred.

Optionally, if precise control over the characteristic of pnp is required, then one extra masking and implant step is used to form the n-type base of the pnp transistor. The n-type base is formed the same way the p-type base is formed for npn transistors. The n-type base can, alternatively, be formed prior to deposition of polysilicon (layer 44).

Thereafter, a mask is formed which exposes regions 48, 34, 52, and 62 which will eventually be the pnp emitter contact, the pnp collector contact, a portion of the resistor, the base npn contacts, and the contact 62. The regions are doped p+ to a concentration of between about $1 \times 10^{19}$ and $1 \times 10^{20}/cm^3$ with a dopant concentration of about $6 \times 10^{19}/cm^3$ preferred using boron. The p+ mask is removed and another mask is formed on the surface of the device to expose regions 46, 54, 24, and 68 which will eventually be used as the pnp base contacts, the npn emitter contact, the npn collector contact, the source/drain contacts, and the gates of the MOS transistors. The regions are doped n+ using an arsenic implant with an energy of about 100 keV to a concentration of between about $5 \times 10^{19}$ and $1 \times 10^{20}/cm^3$. As discussed above, the PMOS gate may be either n+ or p+ and thus may be included in either the n+ or p+ mask. A layer of nitride 98 having a thickness of between about 1,000 and 1,200 Å is then deposited for the purpose of preventing etch undercutting of the underlying polysilicon, and preventing the later link implant from going into gates and various contacts. The polysilicon layer 44 is then annealed at 900° C. for a time of about 15 minutes.

Figure 2D:
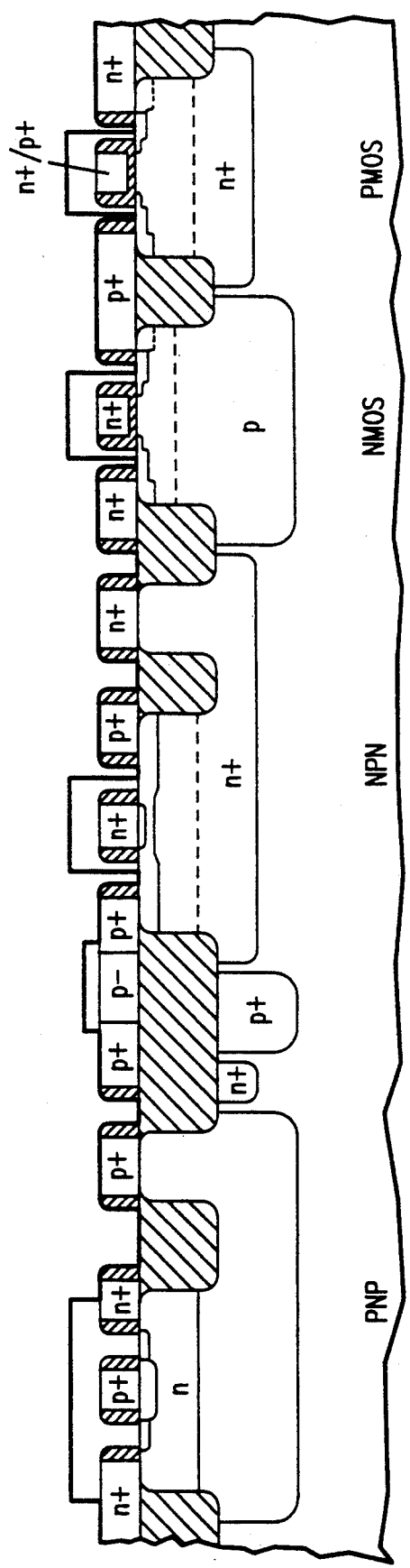

The device is illustrated in FIG. 2D after the next set of fabrication steps. A mask is formed on the surface of the nitride to protect the base, emitter, and collector contacts of the bipolar transistors and the source, gate, and drains of the NMOS and PMOS transistors. A dry etch with chlorine chemistry results in the formation of the base, emitter, collector, source and drain contacts, as well as the gates of the MOS transistors. The etch is conducted such that the bipolar base and the epitaxial region adjacent the gates of the MOSFETs are etched below the original epitaxial surface by about 1,000 to 2,000 Å. The etch mask is removed. A lightly doped drain (LDD) implant is performed in which the source and the drain of the NMOS transistor are lightly implanted with an n-type dopant such as phosphorus using an implant energy of between about 20 and 50 keV with implant energies of between about 20 and 40 keV preferred. This implant results in source and drain regions which are self-aligned to the NMOS gate with a dopant concentration of about $5 \times 10^{17}$ and $1 \times 10^{19}/cm^3$.

After an oxidation step to grow a cap oxide, a p-type LDD using a dopant such as $BF_2$ is performed across the surface of the npn bipolar transistor and the PMOS transistor with the source and drain of the PMOS transistor and the base region of the npn bipolar transistor exposed by a mask. A more heavily doped p-region which is self-aligned to the emitter is formed in the base of the pnp bipolar transistor and a more heavily doped p-region which is self-aligned to the gate is formed around the gate of the PMOS transistor. The implant energy is preferably between about 40 and 60 keV. As shown, more heavily doped well ties are also diffused from the NMOS and PMOS contacts. Also, emitter regions are diffused from the overlying emitter contacts of the pnp and npn transistors and heavily doped extrinsic base regions are diffused from the base contacts of the npn and pnp transistors.

Nitride is stripped from the surface of the device and a Low Temperature Oxide (LTO) deposition is performed. A silicide exclusion mask, not shown, is formed on the device on polysilicon regions where silicide formation is not desired (e.g., over the center portion of the resistor). The oxide is then etched back, leaving spacer oxide on exposed sides of the source contacts, drain contacts, gates, emitters, base contacts, and collector contacts using means known to those of skill in the art. The mask shown in FIG. 2D is then formed over the device for protection of at least the sidewall side on the npn and pnp emitters, the gates of the NMOS and PMOS transistors, the internal sidewalls of the pnp base contacts (i.e., the sidewall of the base contact closest to the emitter contact), and the resistor. The device is etched with BOE for about one minute and the exposed oxide is removed from the sidewall of the resistor/base contacts, the collector contacts, and the source and drain contacts of the NMOS and PMOS transistors.

Figure 2E:
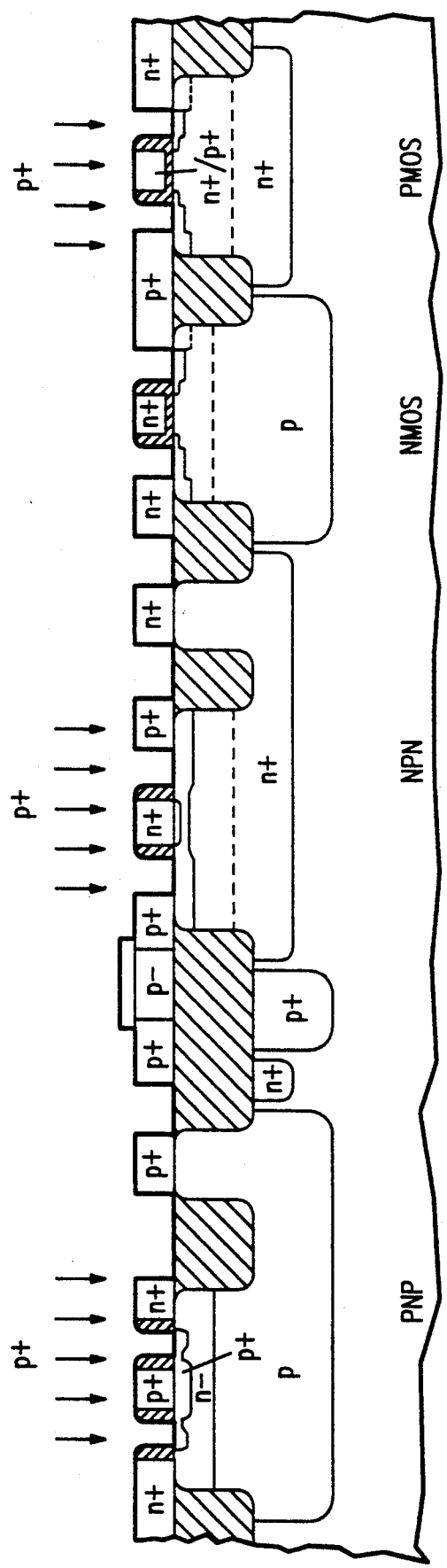

Referring to FIG. 2E, a mask is formed and a heavy p+ ($BF_2$) implant is performed in the regions shown therein, i.e., in the region of the source/drain of the PMOS transistor, the extrinsic base region of the npn transistor, and the exposed monocrystalline region adjacent the emitter contact of the pnp transistor. The purpose of this implant is to further lower the resistances of the source/drain of the MOS transistors and extrinsic base region of the npn transistor. The implant serves to prevent formation of a parasitic Schottky diode between $TiSi_2$ (silicide) and n-type epi. The implant uses an energy of between about 40 and 60 keV.

The final set of fabrication steps serve to complete the device as shown in FIG. 1A. an n+ (arsenic) implant is performed in the region of the source/drain of the NMOS transistor for the purpose of forming the source/drain regions and lowering their resistances. The arsenic implant uses an energy of between about 50 and 100 keV. The device is then, optionally, annealed at a temperature of about 900° to 950° C. for about 10 to 30 minutes or at a temperature of 1000° to 1100° C. for about 10 to 30 seconds using a rapid thermal annealing process.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon. Remaining unreacted metal is then etched away from the device.

Oxide layer 92 is then deposited and masked to form contact holes therein. Metal is deposited on the surface of the device, masked, and etched from selected regions. In alternative embodiments the contact holes are filled with tungsten and etched back so as to form a planar surface before deposition of the metal interconnect layer. Thereafter, additional metallization layers are formed and the device is passivated, providing the structure shown in FIG. 1A.

It is to be understood that the above description is intended to be illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of fabricating a pnp transistor in a common substrate with an n-channel (NMOS) field effect transistor and a p-channel (PMOS) field effect transistor comprising the steps of:

simultaneously implanting p-type dopants into first, second, and third regions of said substrate, said first, second, and third regions forming at least a portion of a buried layer of said pnp transistor, a well region of said NMOS transistor, and a p-type channel stop;

forming an epitaxial silicon layer over at least said first and said second regions, a first portion of said epitaxial silicon layer forming a base region of said pnp transistor and a second portion of said epitaxial silicon layer forming a channel region of said PMOS transistor;

forming an emitter region in contact with said base region of said pnp transistor;

forming source and drain regions in contact with channel regions of said NMOS and PMOS transistor;

forming an npn transistor in said substrate and p-type channel stops adjacent said npn transistor, said step of implanting p-type dopants into first and second regions also implanting p-type dopants to form said channel stops; and implanting n-type dopants into said substrate to form a portion of a buried layer region of said npn transistor, said step of implanting n-type dopants also forming n-type channel stops adjacent said pnp transistor.

2. The method as recited in claim 1 wherein said step of implanting n-type dopants also forms well regions of a p-channel field effect transistor.

3. The method as recited in claim 2 wherein said step of forming an epitaxial layer is a step of forming an n-type epitaxial layer, said n-type epitaxial layer setting a dopant concentration of said base region of said pnp transistor and a channel region of said p-channel field effect transistor.

4. A method of forming npn and pnp bipolar transistors, and n-channel and p-channel field effect transistors on a common substrate comprising the steps of:

in a p-type substrate, implanting p-type dopants to simultaneously form a portion of a buried layer region of said pnp transistors, channel stops adjacent said npn transistors, and well regions of said n-channel field effect transistors;

implanting n-type dopants to simultaneously form n-type channel stops adjacent said pnp transistors, a portion of a buried layer region of said npn transistors, and well regions of said p-channel field effect transistors;

depositing an n-type epitaxial layer on said substrate, said n-type epitaxial layer forming a base region of said pnp transistors;

forming p-type base regions of said npn transistors and p-channel regions of said n-channel field effect transistors;

forming a polycrystalline layer on said epitaxial layer and etching said polycrystalline layer to form gates and contacts for said transistors;

forming oxide sidewalls on emitter contacts of said npn transistors, but not on emitter contacts of said pnp transistors;

implanting p-type dopants to form heavily doped p-type regions adjacent said emitter contacts of said npn and pnp transistors and adjacent gates of said p-channel field effect transistors; and forming a silicide contact layer on exposed silicon along a surface of said substrate.

* * * * *